United States Patent [19]

Mijuskovic

[11] Patent Number: 5,032,797
[45] Date of Patent: Jul. 16, 1991

[54] DIFFERENTIAL INPUT STAGE HAVING IMPROVED COMMON MODE REJECTION

[75] Inventor: Dejan Mijuskovic, Chandler, Ariz.

[73] Assignee: Motorola, Inc., Schaumburg, Ill.

[21] Appl. No.: 577,232

[22] Filed: Sep. 4, 1990

[51] Int. Cl.$^5$ .............................................. M03F 3/45
[52] U.S. Cl. ..................................... 330/253; 330/258
[58] Field of Search ............... 330/252, 253, 257, 258, 330/261, 277, 288, 301

[56] References Cited

U.S. PATENT DOCUMENTS 4,213,098 7/1980 Tsvidis ................................. 330/253
4,897,611 1/1990 Laber et al. ........................... 330/253

Primary Examiner—Steven Mottola
Attorney, Agent, or Firm—Robert D. Atkins

[57] ABSTRACT

A differential input stage is provided having primary and secondary differential input transistors, wherein the secondary differential transistors operating in response to the same common mode input signal conduct equal currents as flowing through the primary differential transistors into a dual output current mirror for supplying the nominal current flowing in the primary differential transistors. Since the dual output current mirror is supplying the current flowing through the primary differential transistors, a differential to single-ended converter normally operating in response to differential currents flowing through the primary differential transistors does not conduct any incremental current induced by the common mode input signal, hence, there is no change in the output voltage thereof.

15 Claims, 2 Drawing Sheets

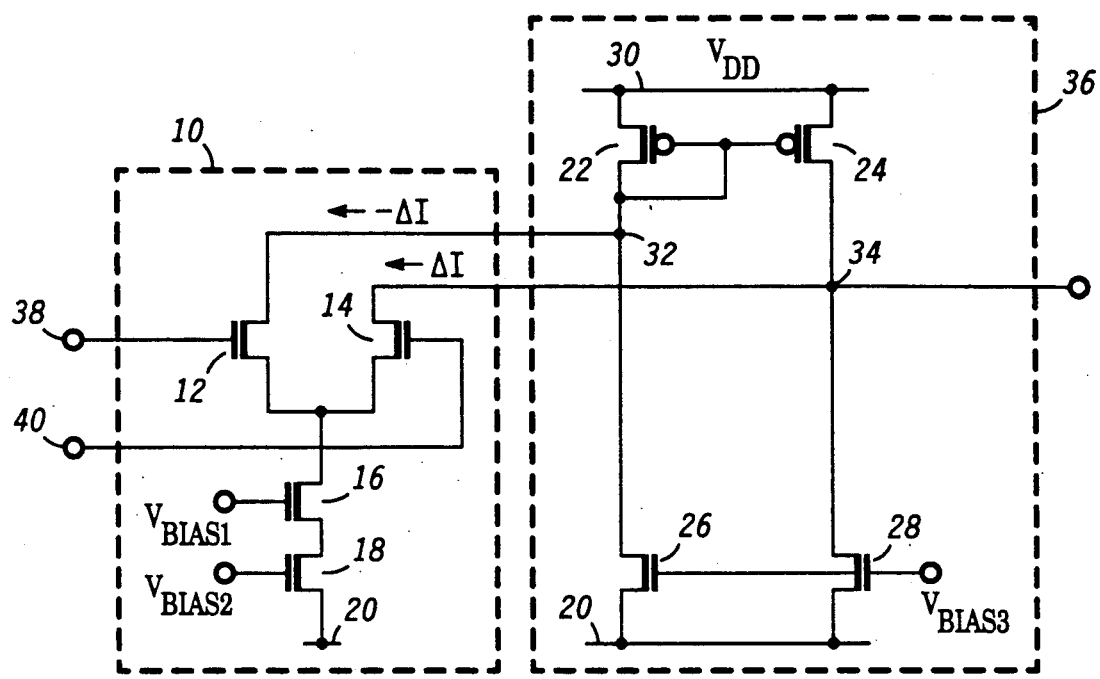
FIG. 1
-PRIOR ART-
FIG. 2
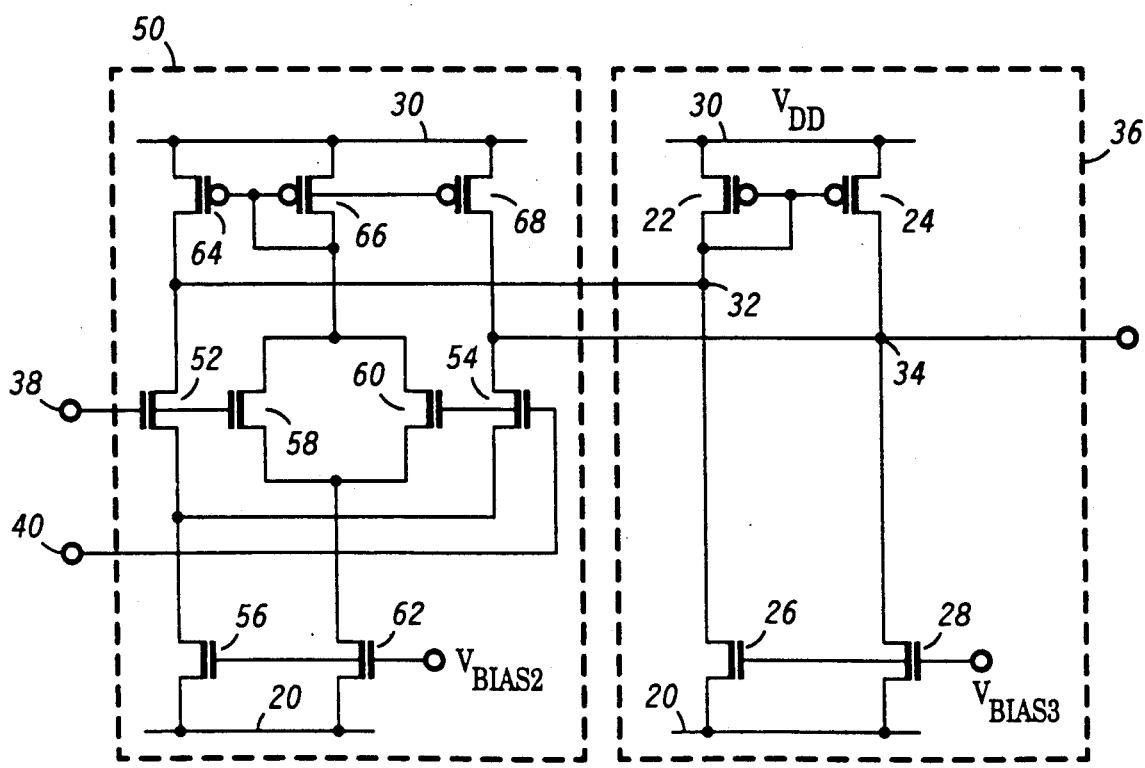

DIFFERENTIAL INPUT STAGE HAVING IMPROVED COMMON MODE REJECTION

FIELD OF THE INVENTION

The present invention relates in general to differential input stages, and more particularly, to a differential input stage of an operational amplifier having improved common mode rejection.

BACKGROUND OF THE INVENTION

Most, if not all, operational amplifiers include a differential input stage responsive to a differential input signal for providing a differential output current which is typically converted through a differential to single-ended converter to a representative output voltage. If the differential input signal is balanced, then the differential output current of the differential input stage is zero. As the differential input signal moves away from a balanced state, the differential output current increases in magnitude accordingly and increases the output voltage. Ideally, the differential input stage produces a non-zero differential output current only as the input signal becomes unbalances; however, conventional differential input stages are susceptible to common mode signals appearing at the inputs thereof which can also produce a non-zero output current and cause an undesirable shift in the output voltage.

The term "common mode rejection" is a measure of how well the differential input stage of the operational amplifier rejects the common mode input signal, appearing as in-phase signals of equal magnitude at both inputs simultaneously and producing an undesirable shift in the output signal of the differential to single-ended converter. The ratio of the common mode input voltage to the output voltage, typically expressed in decibels (dB), indicates the extent to which the operational amplifier maintains zero output voltage given a common mode input signal. A typical common mode rejection ratio may be 100 dB.

Many techniques have been devised for improving the common mode rejection ratio, one of which is covered in the discussion of the prior art as a cascode current source (two transistors in series) for providing a high impedance at the common source terminals of the differential transistors of the input stage. The purpose of the high impedance at the sources of the differential input transistors is to suppress any incremental current flow induced by the common mode input signal which is a principal factor causing the shift in the output signal. The prior art solutions such as the cascode current source continue to have one or more problems with providing satisfactory common mode rejection in that it is difficult to make the impedance of the cascode current source large enough to suppress the incremental current. Moreover, the two serially coupled transistors of the cascode current source limit the dynamic range of the differential input signal. A more desirable approach would be to provide a separate source for the incremental current, rather than attempt to suppress it, such that the incremental output current of the differential input stage does not flow through the differential to single-ended converter and therefore does not effect the output voltage thereof.

Hence, there is a need for a differential input stage having improved common mode rejection for providing substantially zero output signal in the presence of a common mode input signal over the full range of the differential input signal.

SUMMARY OF THE INVENTION

Accordingly, an object of the present invention is to provide an improved differential input stage.

Another object of the present invention is to provide an improved differential input stage having a high common mode rejection ratio.

Yet another object of the present invention is to provide an improved differential input stage having substantially zero output signal in the presence of a common mode input signal over the full range of the differential input signal.

Still another object of the present invention is to provide an improved differential input stage which provides a separate source for any incremental currents induced by a common mode input signal such that the incremental output current of the differential input stage does not flow through the differential to single-ended converter and therefore does not effect the output voltage thereof.

In accordance with the above and other objects there is provided a differential input stage responsive to first and second input signals and comprising a current supply circuit having first and second outputs for providing first and second currents. The gates of the first and second transistors are coupled for receiving the first and second input signals, and the sources of the same are coupled to the first output of the current supply circuit. A current mirror circuit is included having an input and first and second outputs for providing respective output currents. The first output of the current mirror circuit is coupled to the drain of the first transistor, and the second output is coupled to the drain of the second transistor. A first circuit is coupled between the input of the current mirror circuit and the second output of the current supply circuit and operates in response to the first and second input signals for conducting the second current.

BRIEF DESCRIPTION OF THE DRAWING

FIG. 1 is a schematic diagram illustrating a conventional differential input stage;

FIG. 2 is a schematic diagram illustrating one embodiment of the present invention.

DETAILED DESCRIPTION OF THE PRIOR ART

Figure 3:
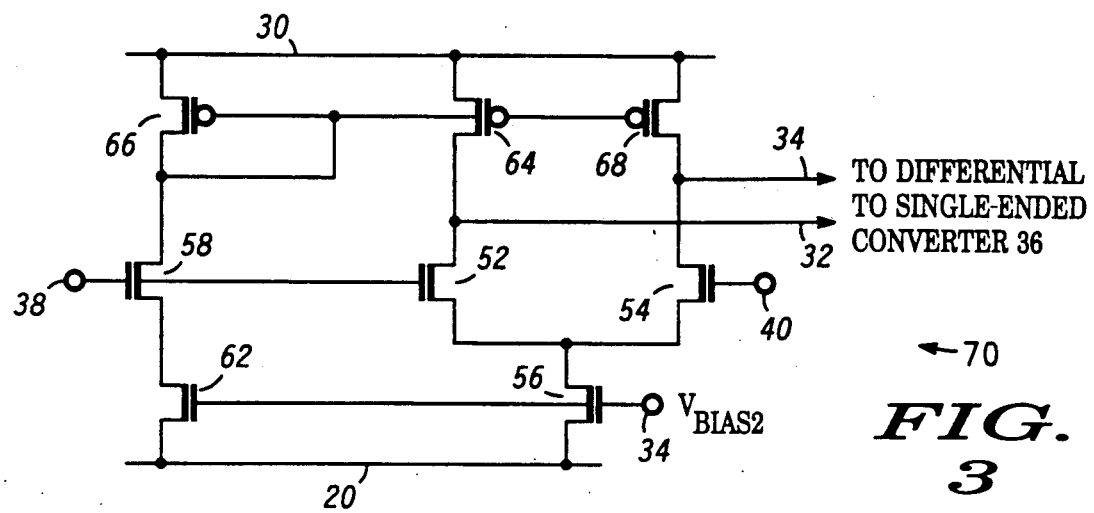
FIGS. 3, 4 and 5 are schematic diagrams illustrating alternate embodiments of the present invention.

A conventional differential input stage 10 is shown in FIG. 1 of the prior art including transistors 12 and 14 having common sources coupled to the cascode current source formed of transistors 16 and 18. The gates of transistors 16 and 18 are responsive to bias potentials $V_{BIAS1}$ and $V_{BIAS2}$, respectively, and the source of transistor 18 is coupled to power supply conductor 20 typically operating at ground potential. The drains of transistors 12 and 14 are coupled to the drains of transistors 22 and 24 and to the drains of transistors 26 and 28, respectively, while the sources of transistors 22 and 24 are coupled to power supply conductor 30 operating at a positive potential such as $V_{DD}$. The sources of transistors 26 and 28 are coupled to power supply conductor 20, and the gates of transistors 26 and 28 are coupled for receiving bias potential $V_{BIAS3}$, while the gates of transistors 22 and 24 are coupled together to the drain of transistor 22 forming a conventional current mirror circuit. Nodes 32 and 34 are provided at the drains of transistors 22 and 24, respectively, as high impedance points for the output signal at node 34. It is understood that current source transistors 26 and 28 may be provided as a cascode transistor pair for providing an even higher impedance at node 34. Likewise, another current mirror like transistors 22 and 24 may be cascoded between nodes 32 and 34 and power supply conductor 30, as is understood. The combination of the current mirror formed of transistors 22 and 24 and the current supply transistors 26 and 28 operates as differential to single-ended converter 36 which is coupled for receiving the currents flowing through transistors 12 and 14 and providing a single output voltage at node 34.

During normal operation, transistors 12 and 14 function as a balanced differential pair conducting differential currents in response to the differential input signal applied at inputs 38 and 40. The current flowing through transistor 22 supplies both transistor 12 and transistor 26, and the current flowing through transistor 24 is split between transistor 14 and the current supply formed of transistor 28. Transistors 26 and 28 conduct equal currents by nature of the same bias potential $V_{BIAS3}$ applied at the gates thereof. For an unbalanced differential input signal where the signal applied at input 38 is less than that applied at input 40, transistor 12 conducts less of the tail current sourced through transistors 16 and 18. A current $-\Delta I$ flows through transistor 12 and transistor 22 where it is mirrored by the current mirror and flows out transistor 24 as current $-\Delta I$. The higher potential at input 40 conducts current $+\Delta I$ through transistor 14 for providing a total differential current of $-2\Delta I$ flowing into node 34 which lowers the potential at node 34. Alternately, if the signal applied at input 38 is greater than that applied at input 40, differential current $+2\Delta I$ flows into node 34 which raises the potential at node 34. Thus, the differential input signal is converted through differential input stage 10 and differential to single-ended converter 36 to a single-ended output signal at node 34.

One point of interest is the common mode rejection of differential input stage 10, wherein an in-phase equal magnitude common mode signal applied at inputs 38 and 40 produce some change in the output signal at node 34. For example, given a high common mode signal applied at inputs 38 and 40 wherein both input signals increase by the same amount, the increased potential at the sources of transistors 12 and 14 cause an incremental tail current to flow through transistors 16 and 18 due to the finite drain-source resistance thereof. This incremental tail current also flows through transistors 12 and 14 and transistors 22 and 24, thereby lowering the output potential at node 34 which is an undesirable result when seeking good common mode rejection. The cascode configuration of transistors 16 and 18 offers some immunity from the common mode input signal as compared to a single transistor current source by increasing the impedance therethrough; however, since the impedance through transistors 16 and 18 is limited, the attempt to suppress the flow of the incremental tail current with higher resistance can achieve only partial common mode rejection. Given the physical properties of the cascode current source, another approach is needed to counter the effects of the incremental current flow. That is, it is important to isolate the incremental current flow from differential to single-ended converter 36 to avoid passing the common mode input signal to the output thereof.

Furthermore, the configuration of cascode transistors 16 and 18 limits the dynamic range of the differential input signal with respect to power supply conductor 20 in that the single-ended magnitudes of the input signals applied at inputs 38 and 40 must always remain greater than the sum of the saturation voltages of transistors 16 and 18 plus the gate-source potential of transistor 12 or 14. Since many applications require the full range of the differential input signal, it is often necessary to limit the tail current source to a single transistor. Unfortunately, a single transistor current source reduces the impedance between the sources of transistors 12 and 14 and power supply conductor 20, thereby increasing the incremental tail current flow in response to a common mode input signal and reducing the common mode rejection ratio.

DETAILED DESCRIPTION OF THE PREFERRED EMBODIMENT

Referring to FIG. 2, there is shown an improved differential input stage 50 responsive to the differential input signal applied at inputs 38 and 40, and including primary differential transistors 52 and 54 each having gates coupled for receiving the differential input signal and sources coupled together to the drain of transistor 56. A secondary differential pair comprising transistors 58 and 60 is also responsive to the differential input signal and include common sources coupled to the drain of transistor 62. The gates of transistors 56 and 62 are responsive to bias signal $V_{BIAS2}$, while the sources of the same are coupled to power supply conductor 20 and therefore conduct equal currents. Differential input stage 50 also includes a dual output current mirror comprising transistors 64, 66, and 68 each having a common source coupled to power supply conductor 30. The drain of transistor 64 is coupled to the drain of transistor 52, and the drain of transistor 66 is coupled to the drains of transistors 58 and 60, while the drain of transistor 68 is coupled to the drain of transistor 54. The gates of transistors 64, 66, and 68 are coupled together to the drain of transistor 66. Other components having a similar function such as differential to single-ended converter 36 are given the same reference numbers as used in FIG. 1.

The operation of differential input stage 50 proceeds as follows. With a balanced differential input signal, transistors 52 and 54 each conduct equal nominal currents as determined by bias potential $V_{BIAS2}$ applied at the gate of transistor 56. Since the gates of transistors 58 and 60 are also responsive to the differential input signal and current supply transistor 62 also receives bias potential $V_{BIAS2}$, transistors 58 and 60 conduct similar currents as transistors 52 and 54. The current flowing through the conduction path including transistors 66, 58, 60 and 62 is mirrored through transistor 64 and 68 for providing the nominal currents flowing through transistors 52 and 54. Current supply transistor 62 in response to bias potential $V_{BIAS2}$ and the common mode input signal thus determines the input current to the current mirror (64–68). Bias potential $V_{BIAS3}$ establishes a predetermined current flowing through transistors 26 and 28 and the current mirror formed of transistors 22 and 24, although no current flows from transistors 22 and 24 into differential input stage 50. Thus for a balanced condition, the currents flowing through transistors 52 and 54 is supplied by transistors 64 and 68, respectively, rather than by differential to singled-ended converter 36 as taught the prior art.

If a common mode input signal should raise the signal level applied at the gates of transistors 52 and 54, the potential developed at the sources of transistors 52 and 54 also increases causing an incremental tail current to flow through transistor 56 as discussed for the prior art. With the common mode input signal applied at the gates of differential transistors 58 and 60, the same incremental tail current flows through transistor 62 and transistors 58 and 60 and continues through transistor 66 where it is mirrored by transistors 64 and 68 for supplying the incremental currents in transistors 52 and 54. Thus for a balanced common mode input signal, no currents flow from transistors 22 and 24 into differential input stage 50 as transistors 64 and 68 supply any incremental current changes in transistors 52 and 54. The potentials at nodes 32 and 34 remain unchanged thereby providing an improved common mode rejection. Rather than attempt to suppress the incremental tail current flow as is common in the prior art, the present invention detects the incremental current flow with transistors 58 and 60 and provides an alternate source thereof via the dual output current mirror of transistors 64-68.

It is also possible to scale the sizes of transistors 58 and 60 such that the currents flowing through transistors 52 and 54 are proportional to that flowing through transistors 58 and 60. For such an application, transistors 64-68 must be similarly scaled such that transistors 64 and 68 continue to supply the nominal currents of transistors 52 and 54. Furthermore, it is understood that current supply transistors 56 and 62 may be replaced with cascode transistor pairs for providing higher impedance at the sources of transistors 52 and 54 for reducing the incremental tail current flow. Transistors 64 and 68 continue to supply whatever current is demanded by the common mode input signal.

For an unbalanced differential input signal, transistors 52 and 54 and transistors 58 and 60 each conduct differential currents $+\Delta I$ and $-\Delta I$; however, since the drains of transistors 58 and 60 are coupled together, the differential current flowing the latter cancel yielding no change in the input and output currents of transistors 64-68. Consequently, transistors 22 and 24 supply the differential current of transistors 52 and 54 which alters the output signal at node 34 in response to the unbalanced differential input signal as is appropriate. The unbalanced differential input signal is thus converted through differential input stage 50 and differential to single-ended converter 36 to a single-ended output signal at node 34.

An alternate embodiment of the present invention is shown in FIG. 3 where differential input stage 70 includes the same components described in FIG. 2 less transistor 60. Transistor 60 is optional in that the input current to the current mirror formed of transistors 64-68 is still supplied via transistor 62 operating in response to bias potential $V_{BIAS2}$. One advantage of the configuration of FIG. 3 is the reduction in the stray capacitance associated with the gate of transistor 60 from FIG. 2 at the gate of transistor 54. Although the embodiment of FIG. 3 allows the differential $\Delta I$ to flow into the current mirror transistors 64-68, the effect is typically small and occurs only during transient response. In some applications, this error is acceptable in view of the reduced stray capacitance advantage.

Figure 4:
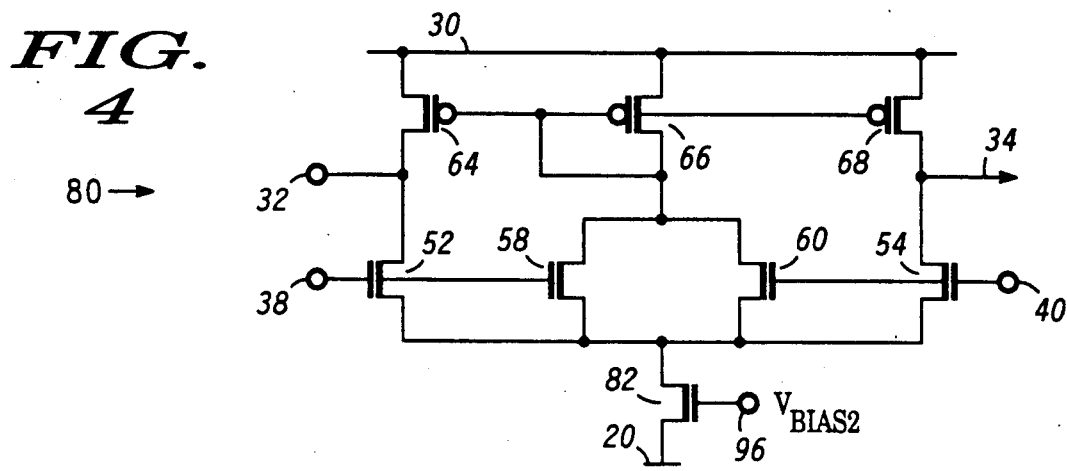

Turning to FIG. 4, there is shown yet another embodiment as differential input stage 80, wherein current sources 56 and 62 are combined as current supply transistor 82. For this embodiment, bias potential $V_{BIAS2}$ is typically selected for providing twice the current through transistor 82 as that of transistor 56. The operation of differential input stage 80 as shown in FIG. 4 follows the discussion of FIG. 2 as the incremental currents from a common mode input signal flowing through transistors 52 and 54 are equal to that flowing in transistors 58 and 60. The incremental currents are reflected through the dual output current mirror for supplying the incremental currents in transistors 52 and 54. Otherwise, components having a similar function are given the same reference numbers as used in FIG. 2.

Figure 5:
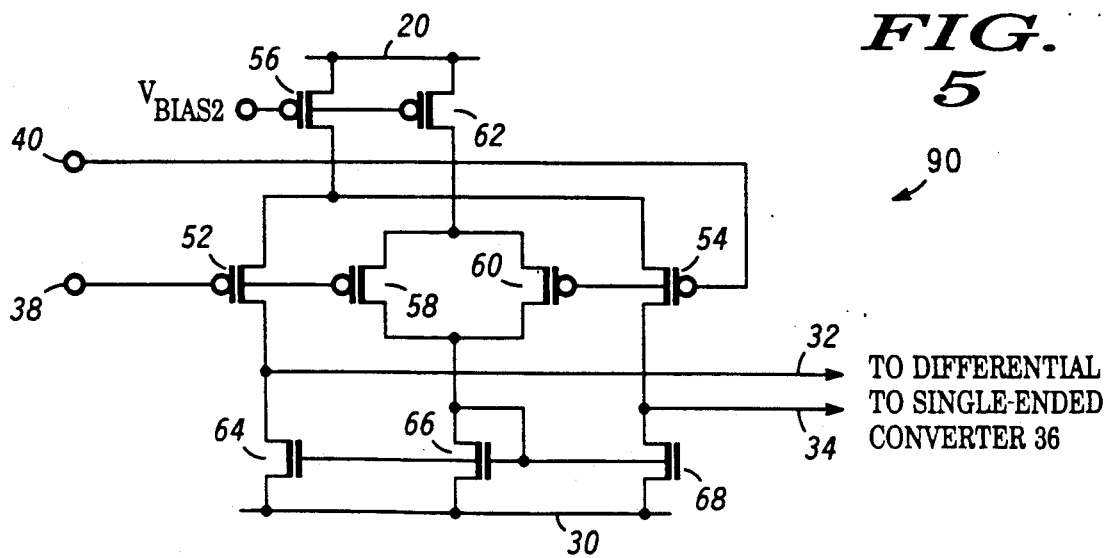

Still another embodiment of the present invention is shown in FIG. 5 as differential input stage 90 using opposite polarity transistors, i.e., the p-channel devices are converted to n-channel and visa versa. In addition, the supply voltage applied at power supply conductors 20 and 30 are swapped. The components of differential input stage 90 are given the same reference numbers as used in FIG. 2 due to the similar function and overall operation. Thus, the improved differential input stage may be implemented in either p-channel or n-channel form.

Hence, what has been described is a novel differential input stage having primary and secondary differential input transistors, wherein the secondary differential transistors operating in response to the same common mode input signal conduct equal currents as flowing through the primary differential transistors into a dual output current mirror for supplying the nominal current flowing in the primary differential transistors. The differential to single-ended converter coupled to the output of the differential input stage does not supply any current for the common mode input signal, hence, there is no effect on the output voltage thereof.

I claim:

1. A differential input stage responsive to first and second input signals, comprising:
   current supply means having first and second outputs for providing first and second currents;
   first and second transistors each having a gate, a drain and a source, said gates being respectively coupled for receiving the first and second input signals, said sources being coupled to said first output of said current supply means;
   a current mirror circuit having an input and having first and second outputs for providing respective output currents, said first output being coupled to said drain of said first transistor, said second output being coupled to said drain of said second transistor; and
   first means coupled between said input of said current mirror circuit and said second output of said current supply means and responsive to the first and second input signals for conducting said second current.

2. The differential input stage of claim 1 wherein said current mirror circuit includes:
   a third transistor having a gate, a drain and a source, said source being coupled to a first source of operating potential, said gate and drain being coupled together to said input of said current mirror circuit;
   a fourth transistor having a gate, a drain and a source, said source being coupled to said first source of operating potential, said drain being coupled to said drain of said first transistor, said gate being coupled to said gate of said third transistor; and a fifth transistor having a gate, a drain and a source, said source being coupled to said first source of operating potential, said drain being coupled to said drain of said second transistor, said gate being coupled to said gate of said third transistor.

3. The differential input stage of claim 2 wherein said first means includes a sixth transistor having a gate, a drain and a source, said drain being coupled to said drain of said third transistor, said source being coupled to said second output of said current supply means, said gate being coupled for receiving the first input signal.

4. The differential input stage of claim 3 wherein said first means further includes a seventh transistor having a gate, a drain and a source, said drain being coupled to said drain of said third transistor, said source being coupled to said second output of said current supply means, said gate being coupled for receiving the second input signal.

5. The differential input stage of claim 4 wherein said current supply means includes:
an eighth transistor having a gate, a drain and a source, said drain being coupled to said sources of said first and second transistors, said gate being coupled for receiving a bias potential, said source being coupled to a second source of operating potential; and
a ninth transistor having a gate, a drain and a source, said drain being coupled to said sources of said sixth and seventh transistors, said gate being coupled for receiving said bias potential, said source being coupled to said second source of operating potential.

6. A differential input stage responsive to first and second input signals, comprising:
current supply means having an output for providing a first current;
first and second transistors each having a gate, a drain and a source, said gate of said first transistor being coupled for receiving the first input signal, said gate of said second transistor being coupled for receiving the second input signal, said sources being coupled to said output of said current supply means;
a current mirror circuit having an input and having first and second outputs, said first output being coupled to said drain of said first transistor, said second output being coupled to said drain of said second transistor; and
a third transistor having a gate, a drain and a source, said drain being coupled to said input of said current mirror circuit, said source being coupled to said output of said current supply means, said gate being coupled for receiving the first input signal.

7. The differential input stage of claim 6 wherein said current mirror circuit includes:
a fourth transistor having a gate, a drain and a source, said source being coupled to a first source of operating potential, said gate and drain being coupled together to said drain of said third transistor;
a fifth transistor having a gate, a drain and a source, said source being coupled to said first source of operating potential, said drain being coupled to said drain of said first transistor, said gate being coupled to said gate of said fourth transistor; and
a sixth transistor having a gate, a drain and a source, said source being coupled to said first source of operating potential, said drain being coupled to said drain of said second transistor, said gate being coupled to said gate of said fourth transistor.

8. The differential input stage of claim 7 further includes a seventh transistor having a gate, a drain and a source, said drain being coupled to said drain of said fourth transistor, said source being coupled to said output of said current supply means, said gate being coupled for receiving the second input signal.

9. The differential input stage of claim 8 wherein said current supply means includes an eighth transistor having a gate, a drain and a source, said drain being coupled to said sources of said first, second, third and seventh transistors, said gate being coupled for receiving a bias potential, said source being coupled to a second source of operating potential.

10. An integrated differential input circuit responsive to first and second input signals, comprising:
current supply means having first and second outputs for providing first and second currents;
first and second transistors each having a gate, a drain and a source, said gate of said first transistor being coupled for receiving the first input signal, said gate of said second transistor being coupled for receiving the second input signal, said sources being coupled to said first output of said current supply means;
a current mirror circuit having an input and having first and second outputs for providing respective output currents, said first output being coupled to said drain of said first transistor, said second output being coupled to said drain of said second transistor; and
first means coupled between said input of said current mirror circuit and said second output of said current supply means and responsive to the first and second input signals for conducting said second current.

11. The differential input circuit of claim 10 wherein said current mirror circuit includes:
a third transistor having a gate, a drain and a source, said source being coupled to a first source of operating potential, said gate and drain being coupled together to said input of said current mirror circuit;
a fourth transistor having a gate, a drain and a source, said source being coupled to said first source of operating potential, said drain being coupled to said drain of said first transistor, said gate being coupled to said gate of said third transistor; and
a fifth transistor having a gate, a drain and a source, said source being coupled to said first source of operating potential, said drain being coupled to said drain of said second transistor, said gate being coupled to said gate of said third transistor.

12. The differential input stage of claim 11 wherein said first means includes a sixth transistor having a gate, a drain and a source, said drain being coupled to said drain of said third transistor, said source being coupled to said second output of said current supply means, said gate being coupled for receiving the first input signal.

13. The differential input stage of claim 12 wherein said first means further includes a seventh transistor having a gate, a drain and a source, said drain being coupled to said drain of said third transistor, said source being coupled to said second output of said current supply means, said gate being coupled for receiving the second input signal.

14. The differential input stage of claim 13 wherein said current supply means includes:

an eighth transistor having a gate, a drain and a source, said drain being coupled to said sources of said first and second transistors, said gate being coupled for receiving a bias potential, said source being coupled to a second source of operating potential; and a ninth transistor having a gate, a drain and a source, said drain being coupled to said sources of said sixth and seventh transistors, said gate being coupled for receiving said bias potential, said source being coupled to said second source of operating potential.

15. A method of providing common mode rejection through a differential input stage, comprising the steps of:

receiving first and second common mode input signals at the control inputs of first and second differentially coupled transistors of the differential input stage;

conducting first and second currents through said first and second differentially coupled transistors respectively;

detecting variation in said first and second currents induced by said first and second common mode input signals;

supplying a third current having a similar variation as detected in said first and second currents; and mirroring the variation of said third current into both conduction paths of said first and second differentially coupled transistors to compensate for the variation of said first and second currents flowing through first and second differentially coupled transistors.

* * * * *